(12) United States Patent
Muto

(10) Patent No.: US 9,337,797 B2
(45) Date of Patent: May 10, 2016

(54) HIGH FREQUENCY MODULE

(71) Applicant: Murata Manufacturing Co., Ltd., Nagaokakyo-shi, Kyoto-fu (JP)

(72) Inventor: Hideki Muto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/688,029

(22) Filed: Apr. 16, 2015

(65) Prior Publication Data

US 2015/0223319 A1 Aug. 6, 2015

Related U.S. Application Data

(63) Continuation of application No. PCT/JP2013/076770, filed on Oct. 2, 2013.

(30) Foreign Application Priority Data

Oct. 17, 2012 (JP) .................................. 2012-229671

(51) Int. Cl.
*H03H 7/01* (2006.01)
*H03F 3/19* (2006.01)
(Continued)

(52) U.S. Cl.
CPC .............. *H03H 7/0115* (2013.01); *H03F 1/565* (2013.01); *H03F 3/19* (2013.01); *H03F 3/195* (2013.01); *H03F 3/21* (2013.01); *H03H 7/0161* (2013.01); *H03H 7/1775* (2013.01); *H05K 1/0206* (2013.01); *H05K 1/165* (2013.01); *H03F 2200/165* (2013.01); *H03F 2200/447* (2013.01);

(Continued)

(58) Field of Classification Search
CPC ................... H03H 2001/0085; H03H 7/0115; H03H 7/0161; H03H 7/1775; H03F 3/19; H03F 3/21; H05K 1/0206; H05K 1/165
USPC .................................... 333/175, 185; 330/277
See application file for complete search history.

(56) References Cited

U.S. PATENT DOCUMENTS

2003/0038689 A1 2/2003 Yamaguchi
2005/0116787 A1 6/2005 Ohi et al.
(Continued)

FOREIGN PATENT DOCUMENTS

CN 101473433 A 7/2009
JP 2001-156556 A 6/2001
(Continued)

OTHER PUBLICATIONS

Official Communication issued in International Patent Application No. PCT/JP2013/076770, mailed on Jan. 14, 2014.
(Continued)

*Primary Examiner* — Benny Lee
*Assistant Examiner* — Albens Dieujuste
(74) *Attorney, Agent, or Firm* — Keating & Bennett, LLP

(57) ABSTRACT

A high frequency module includes a multilayer substrate, a power amplifier, thermal vias, and a bandpass filter. The power amplifier is mounted on the multilayer substrate. The thermal vias are provided in the multilayer substrate directly below the power amplifier and configured to dissipate heat of the power amplifier. The bandpass filter is provided in the multilayer substrate and connected to the power amplifier. The thermal via defines an inductor included in the bandpass filter. The bandpass filter overlaps the power amplifier when viewed in a lamination direction of the multilayer substrate.

18 Claims, 3 Drawing Sheets

(51) Int. Cl.
  *H05K 1/02* (2006.01)
  *H03F 3/21* (2006.01)
  *H03F 1/56* (2006.01)
  *H03F 3/195* (2006.01)
  *H04B 1/18* (2006.01)
  *H05K 1/16* (2006.01)
  *H03H 1/00* (2006.01)

(52) U.S. Cl.
  CPC .......... *H03H 2001/0085* (2013.01); *H04B 1/18* (2013.01); *H05K 1/0243* (2013.01); *H05K 1/0298* (2013.01); *H05K 1/162* (2013.01)

(56) References Cited

U.S. PATENT DOCUMENTS

2008/0136559 A1   6/2008   Takahashi et al.

2010/0059879 A1   3/2010   Bielen

FOREIGN PATENT DOCUMENTS

| JP | 2003-110314 A | 4/2003 |
| JP | 2003-124769 A | 4/2003 |
| JP | 2005-079885 A | 3/2005 |
| JP | 2005-123909 A | 5/2005 |
| JP | 2005-166702 A | 6/2005 |
| JP | 2005-166980 A | 6/2005 |
| JP | 2005-191435 A | 7/2005 |
| JP | 2006-121147 A | 5/2006 |
| JP | 2008-211764 A | 9/2008 |
| JP | 2009-182277 A | 8/2009 |
| JP | 2009-182903 A | 8/2009 |

OTHER PUBLICATIONS

Official Communication issued in corresponding Japanese Patent Application No. 2014-542021, mailed on Feb. 24, 2015.

HIGH FREQUENCY MODULE

BACKGROUND OF THE INVENTION

1. Field of the Invention

The present invention relates to a high frequency module including a high frequency amplifier circuit and an LC circuit.

2. Description of the Related Art

High frequency modules have advantages in downsizing, integration, and the like, and thus are currently embedded in widely prevailing wireless communication devices such as cellular phones and the like. For example, as one kind of the high frequency modules, examples thereof include a high frequency module that is composed of a filter circuit, a matching circuit, an amplifier circuit, and the like, and is used for transmitting and receiving signals. Conventional high frequency modules are, for example, described in Japanese Unexamined Patent Application Publication No. 2006-121147, Japanese Unexamined Patent Application Publication No. 2005-123909, and Japanese Unexamined Patent Application Publication No. 2005-166980.

The high frequency modules described in Japanese Unexamined Patent Application Publication No. 2006-121147 and Japanese Unexamined Patent Application Publication No. 2005-123909 are each provided with a multilayer substrate, a high frequency amplifier circuit, a thermal via, and a filter circuit. The high frequency amplifier circuit is mounted on the multilayer substrate. The thermal via is formed in the multilayer substrate directly below the high frequency amplifier circuit and penetrates through the multilayer substrate. The filter circuit is composed of a surface acoustic wave (SAW) filter that uses a SAW element, and is mounted near the high frequency amplifier circuit.

The high frequency module described in Japanese Unexamined Patent Application Publication No. 2005-166980 is, as is the case with Japanese Unexamined Patent Application Publication No. 2005-123909, provided with a multilayer substrate, a high frequency amplifier circuit, a thermal via, and a filter circuit. The high frequency amplifier circuit is mounted on the multilayer substrate. The thermal via is formed in the multilayer substrate directly below the high frequency amplifier circuit, and penetrates through the multilayer substrate. The filter circuit of Japanese Unexamined Patent Application Publication No. 2005-166980 is an LC filter circuit in which an inductor and a capacitor are combined. The inductor and the capacitor are each formed of electrode patterns formed in the multilayer substrate near the thermal via.

In the cases of the high frequency modules described in Japanese Unexamined Patent Application Publication No. 2006-121147 and Japanese Unexamined Patent Application Publication No. 2005-123909, it is necessary to secure a space for mounting the SAW filter on the multilayer substrate in order to mount the SAW filter on the multilayer substrate.

In the case of the high frequency module described in Japanese Unexamined Patent Application Publication No. 2005-166980, the LC filter circuit is formed inside the multilayer substrate. However, the LC filter circuit cannot be formed directly below the high frequency amplifier circuit since the thermal via is provided directly below the high frequency amplifier circuit. Therefore, it is necessary to secure a space in the multilayer substrate to form the LC filter circuit.

SUMMARY OF THE INVENTION

Preferred embodiments of the present invention provide a small-sized high frequency module with excellent heat dissipation capability.

A high frequency module according to a preferred embodiment of the present invention includes a multilayer substrate, a high frequency amplifier circuit, a thermal via, and an LC circuit. The high frequency amplifier circuit is mounted on the multilayer substrate. The thermal via is provided in the multilayer substrate directly below the high frequency amplifier circuit and configured to dissipate heat of the high frequency amplifier circuit. The LC circuit is provided in the multilayer substrate and connected to the high frequency amplifier circuit. The thermal via defines an inductor included in the LC circuit. The LC circuit overlaps the high frequency amplifier circuit when viewed in a lamination direction of the multilayer substrate.

This configuration allows downsizing of the high frequency module compared to the case where a separate space is secured to provide the LC circuit. Further, this configuration enables the heat dissipation capability of the high frequency module to be maintained.

Further, in the high frequency module according to a preferred embodiment of the present invention, the LC circuit preferably is an LC filter.

The thermal via has a large cross section to improve heat dissipation capability. As a result, the thermal via has a low resistance value. This configuration increases the Q value of the LC filter and improves attenuation characteristics of the LC filter.

Preferably, in the high frequency module according to a preferred embodiment of the present invention, the thermal via penetrates through the multilayer substrate. This configuration allows the high frequency module to have adequate heat dissipation capability.

Further, in the high frequency module according to a preferred embodiment of the present invention, the LC circuit preferably includes an LC parallel resonance circuit, and an inductor that defines a portion of the LC parallel resonance circuit preferably as a loop shape. This configuration further increases the Q value of the LC filter and improves the attenuation characteristics of the LC filter.

Further, the high frequency module according to a preferred embodiment of the present invention may alternatively be configured as follows. The high frequency amplifier circuit includes a plurality of base amplifier circuits connected in cascade. The thermal via configured to dissipate heat from one of the plurality of base amplifier circuits, which is located at the last stage, preferably defines the inductor. A space is created by excluding a thermal via to be used for one of the plurality of base amplifier circuits, and the LC circuit is provided in the space. By excluding a certain thermal via, this configuration allows downsizing of the high frequency module while maintaining the heat dissipation capability for the high frequency amplifier circuit.

According to various preferred embodiments of the present invention, a high frequency module is small-sized compared to the case where a separate space is secured to provide an LC circuit. Further, the heat dissipation capability of the high frequency module is maintained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
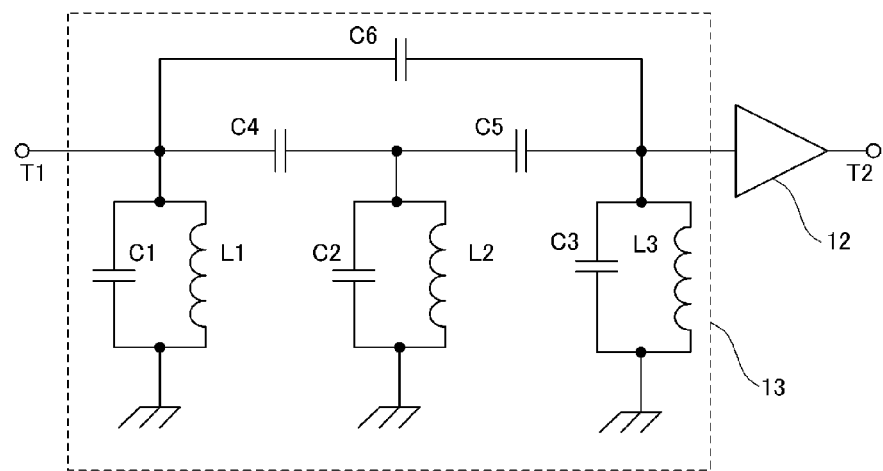
FIG. 1 is a circuit diagram of a high frequency module according to the first preferred embodiment of the present invention.

A high frequency module according to the first preferred embodiment of the present invention is now described. FIG. 1 is a circuit diagram of the high frequency module according to the first preferred embodiment. The high frequency module 1 includes a power amplifier 12 and a bandpass filter 13. The power amplifier 12 corresponds to a high frequency amplifier circuit according to a preferred embodiment of the present invention. The bandpass filter 13 corresponds to an LC circuit and an LC filter according to a preferred embodiment of the present invention.

One end portion of the bandpass filter 13 is connected to an input terminal T1. The other end portion of the bandpass filter 13 is connected to one end portion of the power amplifier 12. The other end portion of the power amplifier 12 is connected to an output terminal T2.

The input terminal T1 is connected to one end portion of a capacitor C4 and to one end portion of a capacitor C6. A connection point of the input terminal T1 and the capacitors C4 and C6 is connected to ground through an LC parallel resonance circuit including a capacitor C1 and an inductor L1.

The other end portion of the capacitor C4 is connected to one end portion of a capacitor C5. A connection point of the capacitors C4 and C5 is connected to ground through an LC parallel resonance circuit including a capacitor C2 and an inductor L2.

The other end portion of the capacitor C5 is connected to the other end portion of the capacitor C6 and to the one end portion of the power amplifier 12. A connection point of the capacitors C5 and C6 and the power amplifier 12 is connected to ground through an LC parallel resonance circuit including a capacitor C3 and an inductor L3.

By properly setting values of the capacitors C1 to C6 and the inductors L1 to L3, the bandpass filter 13 allows only a signal of a certain frequency band to pass. The bandpass filter 13 filters out signals of unwanted frequency bands from an inputted signal. The signal, from which the signals of unwanted frequency bands have been filtered, is sent to the power amplifier 12.

Figure 2:
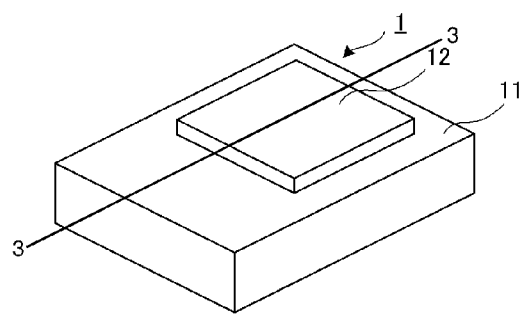
FIG. 2 is an external perspective view of the high frequency module according to the first preferred embodiment of the present invention.
Figure 3:
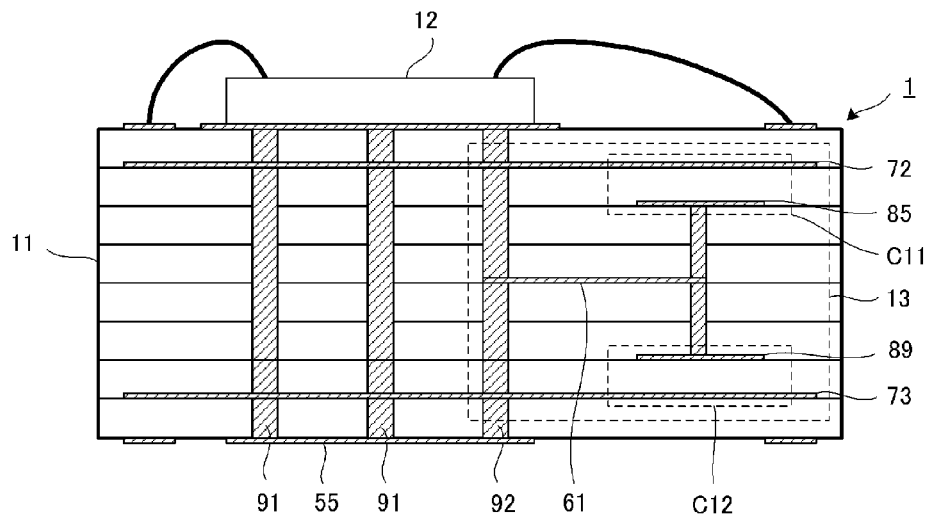
FIG. 3 is a cross sectional view of a relevant portion of the high frequency module according to the first preferred embodiment of the present invention along the cross sectional line 3-3.

FIG. 2 is an external perspective view of the high frequency module according to the first preferred embodiment. FIG. 3 is a cross sectional view of a relevant portion of the high frequency module according to the first preferred embodiment. The high frequency module 1 includes a multilayer substrate 11, the power amplifier 12, and thermal vias 91 and 92.

The multilayer substrate 11 includes dielectric layers, electrode patterns, and via holes. The via holes are not mere through-holes provided in the dielectric layers, but include conductors provided inside the through-holes. The dielectric layers and the electrode patterns are stacked on top of each other, and the via holes penetrate through the dielectric layers. Hereinafter, the electrode patterns that are rectangular or substantially rectangular in shape when viewed in a lamination direction of the multilayer substrate 11 are referred to as plate electrodes, the electrode patterns that define and function as ground are referred to as ground electrodes, and the other electrode patterns are referred to as line electrodes.

The power amplifier 12 is mounted on a first principle surface of the multilayer substrate 11. The thermal vias 91 and 92 are provided directly below the power amplifier 12 and penetrate through the multilayer substrate 11. First end portions of the thermal vias 91 and 92 are connected to the power amplifier 12. Second end portions of the thermal vias 91 and 92 are connected to a ground terminal 55. The ground terminal 55 is provided on a second principle surface of the multilayer substrate 11 (the principle surface opposite to the first principle surface).

A ground electrode 72 is provided on the dielectric layer located close to the first principle surface. A ground electrode 73 is provided on the dielectric layer located close to the second principle surface. The ground electrodes 72 and 73 are connected to the thermal vias 91 and 92. A plate electrode 85 faces the ground electrode 72. A plate electrode 89 faces the ground electrode 73. The plate electrodes 85 and 89 are connected to the thermal via 92 through a via hole and a line electrode 61.

The ground electrode 72, the plate electrode 85, and the dielectric layer interposed therebetween define a capacitor C11. The ground electrode 73, the plate electrode 89, and the dielectric layer interposed therebetween define a capacitor C12. The capacitors C11 and C12 define the capacitor C1 illustrated in FIG. 1. The thermal via 92, the line electrode 61, and the via hole connecting the line electrode 61 and the plate electrodes 85 and 89 are used as the inductor L1.

Further, the thermal via 92, the line electrode 61, and the via hole connecting the line electrode 61 and the plate electrodes 85 and 89 define a loop shaped configuration starting from a connection point of the thermal via 92 and the ground electrode 73 when viewed in a direction perpendicular or substantially perpendicular to the lamination direction of the multilayer substrate. Configuring the inductor in a loop shape using the via hole as described above increases the Q value of the inductor.

The bandpass filter 13 preferably is configured to include the capacitors C11 and C12, the inductor L1, and circuit elements that are not illustrated. The bandpass filter 13 partially overlaps the power amplifier 12 when viewed in the lamination direction of the multilayer substrate 11.

Generally, when a capacitor includes one pair of electrodes facing each other and a larger capacitance is desired, it is necessary to increase areas of the principle surfaces of the electrodes facing each other. Further, when the areas of the principle surfaces of the electrodes facing each other are made larger, it is necessary that a size of a high frequency module is larger. In contrast, when the capacitor C1 is defined by connecting the capacitors C11 and C12 in parallel, a larger capacitance of the capacitor C1 is achieved without increasing the areas of the principle surfaces of the plate electrodes 85 and 89. Further, in a case where the capacitors C11 and C12 overlap with each other when viewed in a direction perpendicular or substantially perpendicular to the principle surface of the multilayer substrate 11, it is not necessary to increase the area of the principle surface of the multilayer substrate 11. Accordingly, the capacitor C1 having a large equivalent capacitance is able to be provided in the high frequency module 1 without increasing the size of the high frequency module 1.

Figure 4:
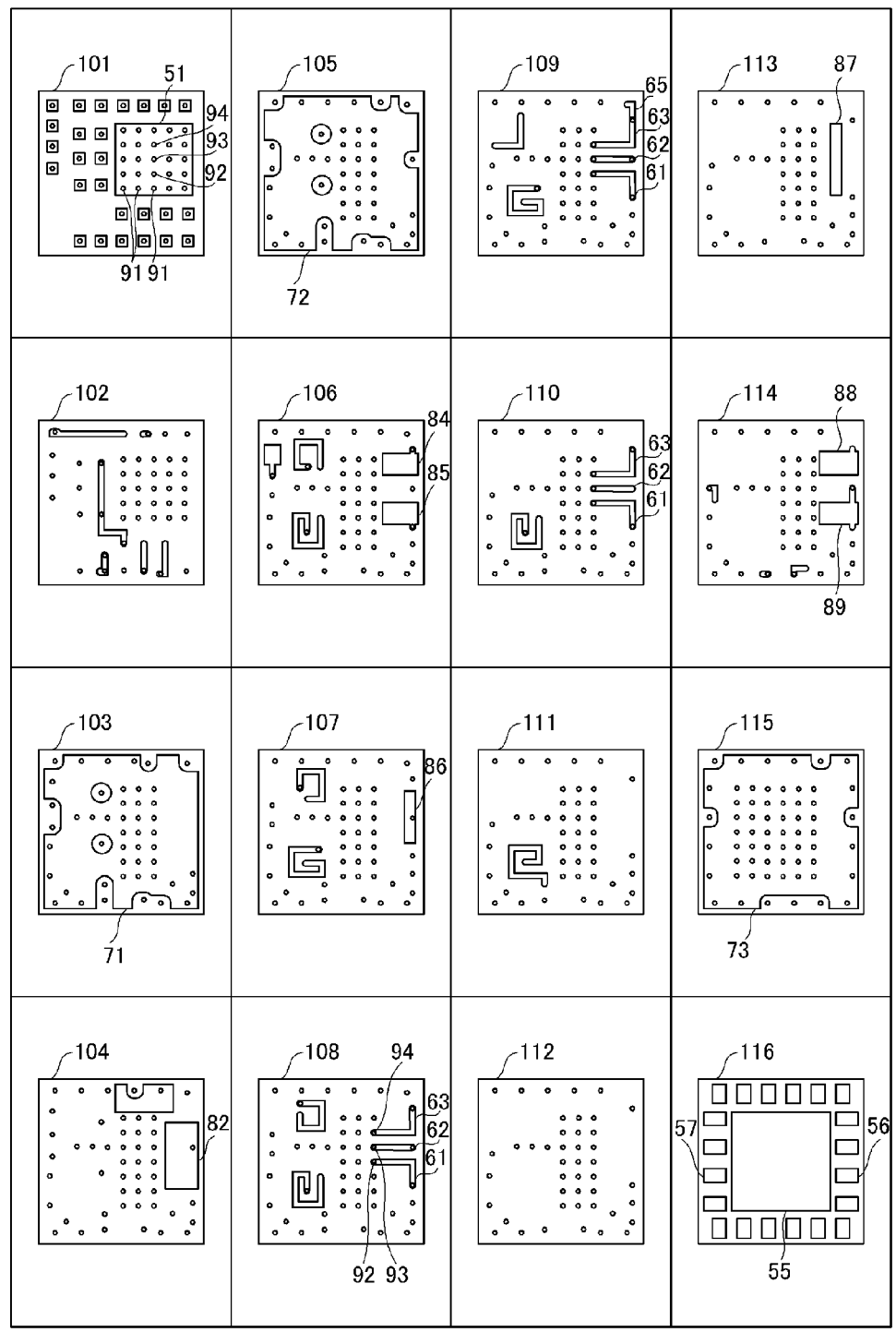
FIG. 4 is a diagram of laminated layers in the high frequency module according to the first preferred embodiment of the present invention.

FIG. 4 is a diagram of laminated layers in the high frequency module according to the first preferred embodiment. The multilayer substrate 11 includes the dielectric layers 101 to 116 that are stacked in the order of the numbers. A principle surface of the dielectric layer 101 is the first principle surface of the multilayer substrate 11. A principle surface of the dielectric layer 116 is the second principle surface of the multilayer substrate 11. Small circles illustrated in FIG. 4 represent via holes.

A mounting land 51 preferably is rectangular or substantially rectangular in shape and provided on the dielectric layer 101. The power amplifier 12 is mounted on the mounting land 51. The thermal vias 91, 92, 93, and 94 are provided directly below the power amplifier 12 and penetrate through the multilayer substrate 11. The thermal vias 91, 92, 93, and 94 are connected to the ground terminal 55 and the ground electrodes 71, 72, and 73.

The ground electrode 71 covers the whole or substantially the whole surface of the dielectric layer 103. The plate electrode 82 is provided on the dielectric layer 104. The ground electrode 72 covers the whole or substantially the whole surface of the dielectric layer 105. The plate electrode 82 and the ground electrode 71 face each other with the dielectric layer 103 interposed therebetween. The plate electrode 82 and the ground electrode 72 face each other with the dielectric layer 104 interposed therebetween. The plate electrode 82, the ground electrodes 71 and 72, and the dielectric layers 103 and 104 define the capacitor C2.

The plate electrodes 84 and 85 are provided on the dielectric layer 106. The plate electrode 86 is provided on the dielectric layer 107. The plate electrode 86 is connected to the plate electrode 82 through a via hole. The plate electrode 84 and the ground electrode 72 face each other with the dielectric layer 105 interposed therebetween. The plate electrode 84, the ground electrode 72, and the dielectric layer 105 define the capacitor C3. The plate electrode 84 and the plate electrode 86 face each other with the dielectric layer 106 interposed therebetween. The plate electrodes 84 and 86 and the dielectric layer 106 define the capacitor C5. The plate electrode 85 and the ground electrode 72 face each other with the dielectric layer 105 interposed therebetween. The plate electrode 85, the ground electrode 72, and the dielectric layer 105 define the capacitor C1. The plate electrode 85 and the plate electrode 86 face each other with the dielectric layer 106 interposed therebetween. The plate electrodes 85 and 86 and the dielectric layer 106 define the capacitor C4.

The line electrodes 61 are provided on the dielectric layers 108 to 110. One end portion of the line electrode 61 is connected to the thermal via 92. The other end portion of the line electrode 61 is connected to the plate electrode 85 through a via hole. The thermal via 92, the line electrode 61, and the via hole connecting the line electrode 61 and the plate electrodes 85 and 89 are used as the inductor L1.

Line electrodes 62 are provided on the dielectric layers 108 to 110. One end portion of the line electrode 62 is connected to the thermal via 93. The other end portion of the line electrode 62 is connected to the plate electrodes 82 and 86 through a via hole. The thermal via 93, the line electrode 62, and the via hole connecting the plate electrode 82 and the line electrode 62 define the inductor L2.

Line electrodes 63 are provided on the dielectric layers 108 to 110. One end portion of the line electrode 63 is connected to the thermal via 94. The other end portion of the line electrode 63 is connected to the plate electrode 84 through a via hole. The thermal via 94, the line electrode 63, and the via hole connecting the line electrode 63 and the plate electrodes 84 and 88 define the inductor L3.

A line electrode 65 is provided on the dielectric layer 109. One end portion of the line electrode 65 is connected to the line electrode 63. The other end portion of the line electrode 65 is an output terminal of the bandpass filter 13 and connected to an input terminal of the power amplifier 12.

A plate electrode 87 is provided on the dielectric layer 113. A plate electrode 88 and the plate electrode 89 are provided on the dielectric layer 114. The ground electrode 73 covers the whole or substantially the whole surface of the dielectric layer 115. The plate electrode 88 is connected to the plate electrode 84 through a via hole. The plate electrode 89 is connected to the plate electrode 85 through a via hole.

The plate electrode 87 and the plate electrodes 88 and face each other with the dielectric layer 113 interposed therebetween. The plate electrodes 87, 88, and 89 and the dielectric layer 113 define the capacitor C6. The plate electrode 88 and the ground electrode 73 face each other with the dielectric layer 114 interposed therebetween. The plate electrode 88, the ground electrode 73, and the dielectric layer 114 define the capacitor C3. The plate electrode 89 and the ground electrode 73 face each other with the dielectric layer 114 interposed therebetween. The plate electrode 89, the ground electrode 73, and the dielectric layer 114 define the capacitor C1.

The ground terminal 55, a high frequency module input terminal 56, and a high frequency module output terminal 57 are provided on the dielectric layer 116 in a specific pattern. The high frequency module input terminal 56 is connected to the plate electrode 89 through a via hole. The high frequency module input terminal 56 corresponds to the input terminal of the bandpass filter 13.

According to the first preferred embodiment, a portion of the bandpass filter 13 is provided in the multilayer substrate 11 directly below the power amplifier 12. This allows downsizing of the high frequency module 1 compared to the case where a separate space is secured to provide the filter therein. Alternatively, a lesser number of the thermal vias may be used, and the whole bandpass filter 13 may be provided in the multilayer substrate 11 directly below the power amplifier 12. This allows further downsizing of the high frequency module 1.

The thermal vias 92, 93, and 94 preferably have large cross sectional areas to improve the heat dissipation capability. By this configuration, the thermal vias 92, 93, and 94 have low resistance values. Thus, using the thermal vias 92, 93, and 94 as the inductors of the bandpass filter 13 increases the Q value of the bandpass filter 13 and improve attenuation characteristics of the bandpass filter 13.

In other words, in cases where the inductors are defined by line electrodes and via holes, and a higher Q value of the bandpass filter 13 is desired, it is necessary to make the widths of the line electrodes wider or make the diameters of the via holes thicker. This increases not only the size of the bandpass filter 13 but also the size of the high frequency module 1. In contrast, in the bandpass filter 13, the thermal vias 92, 93, and 94 that have been already provided in the multilayer substrate 11 are preferably used as the inductors. Thus, the Q value of the bandpass filter 13 is increased without increasing the size of the high frequency module 1.

Further, the thermal vias 91, 92, 93, and 94 penetrate through the multilayer substrate 11. This enables the high frequency module 1 to have adequate heat dissipation capability. Further, the thermal vias 91, 92, 93, and 94 preferably have low resistance values and are directly connected to the ground electrodes 71, 72, and 73. This allows the bandpass filter 13 to utilize the ground having satisfactory characteristics.

Alternatively, the inductors L1, L2, and L3 may be defined by via holes and line electrodes. Further, the inductors L1, L2, and L3 may be defined by via holes and line electrodes in loop shapes. In a case where the inductors including via holes and line electrodes with loop shapes, the Q value of the bandpass filter 13 is higher and the attenuation characteristics of the bandpass filter 13 is improved compared to cases where the inductors do not define loop shapes. Further, the LC circuit according to various preferred embodiments of the present invention may alternatively be a high pass filter or a low pass filter.

Figure 5:
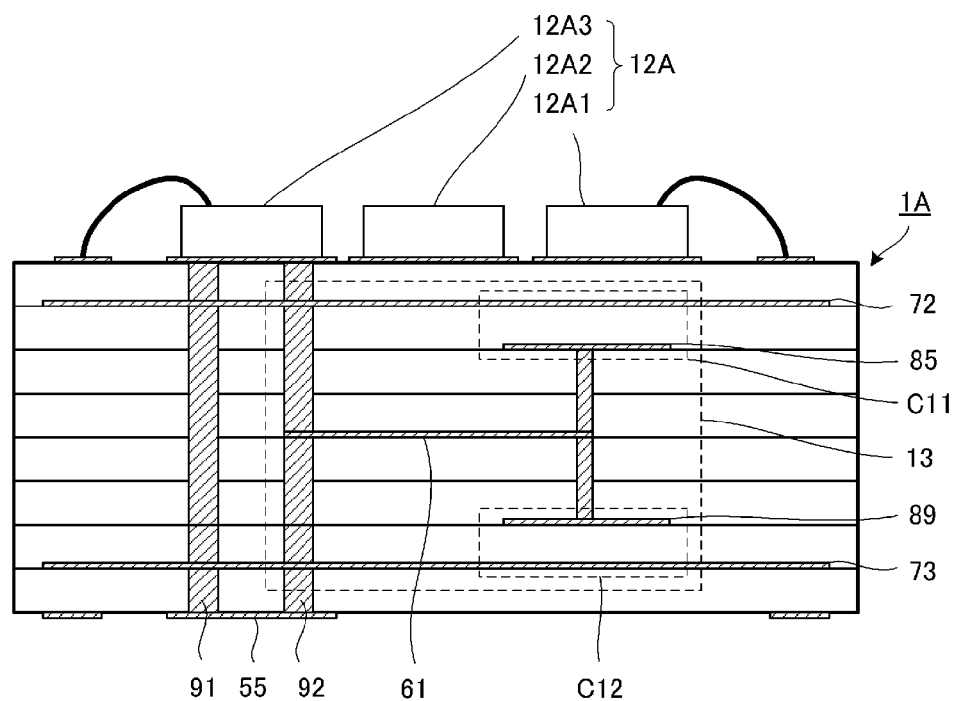
FIG. 5 is a cross sectional view of a relevant portion of a high frequency module according to the second preferred embodiment of the present invention.

A high frequency module according to a second preferred embodiment of the present invention is now described. FIG. 5 is a cross sectional view of a relevant portion of the high frequency module according to the second preferred embodiment. Hereinafter, features that differ from the first preferred embodiment are described.

The high frequency module 1A includes, in place of the power amplifier 12 of the first preferred embodiment, a power amplifier 12A in which power amplifiers 12A1, 12A2, and 12A3 are connected in cascade. The power amplifiers 12A1, 12A2, and 12A3 correspond to base amplifier circuits in various preferred embodiments of the present invention. The power amplifier 12A corresponds to the high frequency amplifier circuit according to various preferred embodiments of the present invention. The power amplifiers 12A1, 12A2, and 12A3 may be made of, for example, FETs or bipolar transistors.

Thermal vias 91 and 92 are provided only directly below the power amplifier 12A3 that is the power amplifier at the last stage, and not provided directly below the power amplifier 12A1 or the power amplifier 12A2. A bandpass filter 13 is provided at an area nearly directly below the power amplifier 12A.

The power amplifier 12A3 at the last stage has a larger load compared to the power amplifiers 12A1 and 12A2. Thus, the amount of heat generation from the power amplifier 12A3 at the last stage defines a major portion of heat generation from the power amplifier 12A. Accordingly, the heat dissipation capability is maintained by providing the thermal vias 91 and 92 directly below the power amplifier 12A3 at the last stage, even though no thermal via is provided directly below the power amplifiers 12A1 and 12A2. This achieves downsizing of the high frequency module 1A while maintaining the heat dissipation capability.

In a case where a desired heat dissipation capability is not obtained, an additional thermal via may be provided directly below the power amplifier 12A2. Further, the number of power amplifiers to be connected in cascade may be four or more, for example. In such case, the thermal vias may be provided directly below a power amplifier at the last stage and directly below a power amplifier of which heat generation cannot be ignored.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency module comprising:
   a multilayer substrate;
   a high frequency amplifier circuit mounted on the multilayer substrate;
   a thermal via provided in the multilayer substrate directly below the high frequency amplifier circuit and configured to dissipate heat of the high frequency amplifier circuit; and
   an LC circuit included in the multilayer substrate and connected to the high frequency amplifier circuit, the LC circuit including an inductor and a capacitor; wherein
   the thermal via defines the inductor; and
   the LC circuit overlaps the high frequency amplifier circuit when viewed in a lamination direction of the multilayer substrate.

2. The high frequency module according to claim 1, wherein the high frequency amplifier circuit includes power amplifiers including one of FETs and bipolar transistors.

3. The high frequency module according to claim 1, wherein the LC circuit is an LC filter.

4. The high frequency module according to claim 1, wherein the thermal via penetrates through the multilayer substrate.

5. The high frequency module according to claim 1, wherein the LC circuit includes an LC parallel resonance circuit, and the inductor included in the LC circuit has a loop shape.

6. The high frequency module according to claim 1, wherein
   the high frequency amplifier circuit includes a plurality of base amplifier circuits connected in cascade;
   the thermal via provided directly below one of the plurality of base amplifier circuits, which is located at a last stage of the cascade, defines the inductor; and
   a space is provided directly below another one of the plurality of base amplifier circuits, and the LC circuit is provided in the space.

7. The high frequency module according to claim 1, wherein the high frequency amplifier circuit defines a power amplifier.

8. The high frequency module according to claim 1, wherein the LC circuit is a band pass filter.

9. The high frequency module according to claim 1, wherein a first end portion of the LC circuit is connected to an input terminal and a second end portion of the LC circuit is connected to one end portion of the high frequency amplifier circuit.

10. The high frequency module according to claim 1, wherein a first end portion of the high frequency amplifier circuit is connected to the LC circuit and a second end portion of the high frequency amplifier circuit is connected to an output terminal.

11. The high frequency module according to claim 1, wherein the LC circuit is an LC parallel resonance circuit including a plurality of capacitors, which includes the capacitor of the LC circuit and a plurality of inductors, which includes the inductor of the LC circuit.

12. The high frequency module according to claim 1, wherein the thermal via penetrating through the multilayer substrate includes a through-hole and a conductor provided inside the through-hole.

13. The high frequency module according to claim 1, wherein a first end portion of the thermal via is connected to the high frequency amplifier circuit and a second end portion of the thermal via is connected to a ground terminal provided on a principle surface of the multilayer substrate.

14. The high frequency module according to claim 1, wherein plate electrodes are connected to the thermal via through a via hole and a line electrode.

15. The high frequency module according to claim 1, wherein the multilayer substrate includes a plurality of dielectric layers, the capacitor of the LC circuit includes a ground electrode, a plate electrode, and one of the plurality of dielectric layers interposed therebetween, and the inductor of the LC circuit is further defined by the thermal via, a line electrode, and a via hole connecting the line electrode and the plate electrode and another plate electrode.

16. The high frequency module according to claim 15, wherein the thermal via, the line electrode, and the via hole define a loop shaped configuration starting from a connection point of the thermal via and the ground electrode when viewed in a direction perpendicular or substantially perpendicular to the lamination direction of the multilayer substrate.

17. The high frequency module according to claim 1, wherein the thermal via includes a plurality of thermal vias that penetrate through the multilayer substrate.

18. The high frequency module according to claim 17, wherein the inductor of the LC circuit is defined by one of the plurality of thermal vias, one of a plurality of line electrodes, and one of a plurality of via holes.

* * * * *